United States Patent
Kim et al.

(10) Patent No.: US 9,905,620 B2
(45) Date of Patent: Feb. 27, 2018

(54) METHOD FOR FABRICATING DISPLAY DEVICE AND DISPLAY DEVICE

(71) Applicant: Samsung Display Co., Ltd., Yongin, Gyeonggi-Do (KR)

(72) Inventors: Mu Gyeom Kim, Hwaseong-si (KR); Taean Seo, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/815,763

(22) Filed: Jul. 31, 2015

(65) Prior Publication Data

US 2016/0260780 A1 Sep. 8, 2016

(30) Foreign Application Priority Data

Mar. 2, 2015 (KR) .................. 10-2015-0029210

(51) Int. Cl.
| | | |
|---|---|---|
| *H01L 27/32* | (2006.01) | |
| *H01L 51/00* | (2006.01) | |
| *G06F 1/16* | (2006.01) | |
| *G06F 3/041* | (2006.01) | |
| *G06F 3/044* | (2006.01) | |

(52) U.S. Cl.
CPC .......... *H01L 27/323* (2013.01); *G06F 1/1652* (2013.01); *G06F 3/044* (2013.01); *G06F 3/0412* (2013.01); *H01L 51/0097* (2013.01); *G06F 2203/04102* (2013.01); *G06F 2203/04103* (2013.01); *H01L 27/322* (2013.01)

(58) Field of Classification Search
CPC ...................................................... H01L 27/323
See application file for complete search history.

(56) References Cited

U.S. PATENT DOCUMENTS

| | | | |
|---|---|---|---|
| 6,582,875 B1 | 6/2003 | Kay et al. | |
| 6,586,153 B2 | 7/2003 | Wolk et al. | |
| 6,610,455 B1 | 8/2003 | Burberry et al. | |
| 7,598,115 B2 | 10/2009 | Song et al. | |
| 8,598,076 B2 | 12/2013 | Shu et al. | |
| 2014/0117324 A1* | 5/2014 | Kim ..................... H01L 27/323 | |
| | | | 257/40 |

FOREIGN PATENT DOCUMENTS

| | | |
|---|---|---|
| KR | 10-0646781 B1 | 11/2006 |
| KR | 10-2009-0122457 A | 11/2009 |
| KR | 10-2009-0128535 A | 12/2009 |
| KR | 10-2013-0007092 A | 1/2013 |
| KR | 10-2013-0010342 A | 1/2013 |
| KR | 10-2013-0023643 A | 3/2013 |
| KR | 10-2014-0035815 A | 3/2014 |

* cited by examiner

*Primary Examiner* — Daniel Shook
(74) *Attorney, Agent, or Firm* — Knobbe Martens Olson & Bear LLP

(57) ABSTRACT

Provided is a method for fabricating a display device. The method for fabricating the display device includes preparing a flexible display panel including a plurality of pixels and a thin film transistor connected to at least one of the plurality of pixels, forming a thin film encapsulation layer over the flexible display panel, and forming a touch screen panel over the thin film encapsulation layer. The touch screen panel is formed at least partly by a transfer process.

17 Claims, 9 Drawing Sheets

METHOD FOR FABRICATING DISPLAY DEVICE AND DISPLAY DEVICE

CROSS-REFERENCE TO RELATED APPLICATIONS

This U.S. non-provisional patent application claims priority under 35 U.S.C. § 119 of Korean Patent Application No. 10-2015-0029210, filed on Mar. 2, 2015, the entire contents of which are hereby incorporated by reference.

BACKGROUND

The present disclosure disclosed herein relates to a method for fabricating a display device and a display device, and more particularly, to a method for fabricating a display device, which is capable of reducing an occurrence of cracks, and a display device.

Generally, flexible display devices receive great attention as they can be used in various electronic devices, such as digital cameras, video cameras, portable information terminals, smart phones, ultra slim notebook computers, tablet personal computers, displays for mobile devices, large scale electronic products such as ultrathin televisions, or large scale electrical products. The flexible display device may include a flexible display panel and an additional layer formed on the flexible display panel.

An organic layer included in the flexible display panel may be vulnerable to moisture and oxygen. Thus, an encapsulation layer for protecting the organic layer against the moisture and oxygen contained in air is disposed on the flexible display panel. For example, an encapsulation layer having a thin film shape, i.e., a thin film encapsulation layer may be mainly disposed on the flexible display panel. In general, the flexible module including a touch screen panel may be fabricated by performing a lamination process on the thin film encapsulation layer.

SUMMARY

The present disclosure provides a method for fabricating a display device, in which a fabricating process is simplified, and the fabricated display device is reduced in thickness.

The present disclosure also provides a display device that is fabricated through a simple fabricating process and has a thin thickness.

One aspect of the invention provides a method for fabricating a display device, which may comprise: preparing a flexible display panel comprising a plurality of pixels and a thin film transistor connected to at least one of the plurality of pixels; forming a thin film encapsulation layer over the flexible display panel; and forming a touch screen panel over the thin film encapsulation layer, wherein the touch screen panel is formed at least partly by a transfer process.

In the foregoing method, the forming of the touch screen panel may comprise: arranging a first transfer sheet over the encapsulation layer, the first transfer sheet comprising a first transfer layer; and providing heat or light to the first transfer sheet, thereby transferring the first transfer layer over the thin film encapsulation layer, wherein the touch screen panel comprises the first transfer layer transferred over the thin film encapsulation layer. The first transfer sheet may comprise: a first base film; a first expansion layer formed over the first base film; and the first transfer layer formed over the first expansion layer, the first transfer layer comprises a first surface facing away from the first base film, wherein arranging comprises disposing the first transfer sheet over the thin film encapsulation layer such that the first surface faces the thin film encapsulation layer.

Still in the foregoing method, the method may further comprise forming an optical layer comprising a color filter and a black matrix over the thin film encapsulation layer, wherein the optical layer is formed at least partly by a transfer process. The forming of the optical layer may comprise: arranging a second transfer sheet over the encapsulation layer, the second transfer sheet comprising a second transfer layer; and providing heat or light to the second transfer sheet, thereby transferring the second transfer layer over the thin film encapsulation layer, wherein the optical layer comprises the second transfer layer transferred over the thin film encapsulation layer. The second transfer sheet may comprise: a second base film; a second expansion layer formed over the second base film; and the second transfer layer formed over the second expansion layer, the second transfer layer comprises a second surface facing away from the second base film, wherein arranging comprises disposing the second transfer sheet over the thin film encapsulation layer such that the second surface faces the thin film encapsulation layer.

Yet in the foregoing method, the touch screen panel may be disposed between the flexible display panel and the optical layer. The touch screen panel may comprise a detection electrode, and wherein the optical layer comprises the color filter disposed over the detection electrode. The optical layer may be disposed between the flexible display panel and the touch screen panel. The touch screen panel may comprise a detection electrode formed over the black matrix. The touch screen panel may further comprise another black matrix which covers the detection electrode and is formed over the detection electrode by using a transfer process, the detection electrode being disposed between the black matrix and the other black matrix, wherein the substantially entire portion of the detection electrode overlaps the black matrix and the other black matrix when viewed in a direction perpendicular to a major surface of the thin film encapsulation layer.

Another aspect of the invention provides a display device, which may comprise: a flexible display panel comprising a plurality of pixels and a thin film transistor connected to at least one of the plurality of pixels; a thin film encapsulation layer disposed over the flexible display panel; and a touch screen panel disposed over the thin film encapsulation layer, the touch screen panel comprises a portion fabricated by using a transfer process.

In the foregoing device, the display device may further comprise: a color filter disposed over the thin film encapsulation layer; and a black matrix disposed over the thin film encapsulation layer, wherein each of the color filter and the back matrix is fabricated by using a transfer process. The color filter and the black matrix may be disposed over the touch screen panel. The touch screen panel may further comprise a detection electrode configured to recognize a user's touch, wherein the color filter is disposed over the detection electrode.

Still in the foregoing device, the touch screen panel may be disposed over the color filter and the black matrix. The touch screen panel may comprise a detection electrode configured to recognize a user's touch, wherein the detection electrode is disposed over the black matrix. The display device may further comprise another black matrix disposed over the black matrix and the detection electrode to cover the detection electrode, wherein the other black matrix is fabricated by using a transfer process, wherein the substantially entire portion of the detection electrode overlaps the black matrix and the other black matrix when viewed in a direction perpendicular to a major surface of the thin film encapsulation layer.

A further aspect of the invention provides a display device, which may comprise: a flexible display panel comprising a plurality of pixels and a thin film transistor connected to at least one of the plurality of pixels; a thin film encapsulation layer disposed over the flexible display panel; and a flexible module layer disposed over the thin film encapsulation layer, the flexible module layer comprises at least a portion fabricated by using a transfer process. In the foregoing device, the flexible module layer may comprise a touch panel, wherein the at least a portion comprises a plurality of electrodes of the touch panel.

Embodiments of the inventive concept provide methods for fabricating a display device, the method including: preparing a flexible display panel including a plurality of pixels and a thin film transistor connected to at least one of the plurality of pixels; forming a thin film encapsulation layer on the flexible display panel; and performing a transfer process on the thin film encapsulation layer to form a touch screen panel.

In some embodiments, the forming of the touch screen panel may include: providing a first transfer substrate; and providing heat or light to the first transfer substrate to transfer a first transfer layer on the thin film encapsulation layer.

In other embodiments, the providing of the first transfer substrate may include: providing a first expansion layer on a first base film; providing the first transfer layer on the first expansion layer; and disposing the first transfer layer and the thin film encapsulation layer to face each other.

In still other embodiments, the methods may further include performing the transfer process on the thin film encapsulation layer to form a color filter and a black matrix.

In even other embodiments, the forming of the color filter and the black matrix may include: providing a second transfer substrate; and providing heat or light to the second transfer substrate to transfer a second transfer layer on the thin film encapsulation layer.

In yet other embodiments, the providing of the second transfer substrate may include: providing a second expansion layer on a second base film; providing the second transfer layer on the second expansion layer; and disposing the second transfer layer and the thin film encapsulation layer to face each other.

In further embodiments, the forming of the color filter and the black matrix may include forming the color filter and the black matrix on the touch screen panel.

In still further embodiments, the forming of the touch screen panel may further include forming a detection electrode for recognizing touch or proximity touch. The forming of the color filter and the black matrix may further include forming the color filter on the detection electrode.

In even further embodiments, the forming of the touch screen panel may include forming the touch screen panel on the color filter and the black matrix.

In yet further embodiments, the forming of the touch screen panel may further include forming a detection electrode for recognizing touch or proximity touch. The forming of the detection electrode may include forming the detection electrode on the black matrix.

In much further embodiments, the forming of the touch screen panel may further include forming a cover black matrix, which covers the detection electrode, on the black matrix and the detection electrode by using the transfer process.

In other embodiments of the inventive concept, display devices include: a flexible display panel including a plurality of pixels and a thin film transistor connected to at least one of the plurality of pixels; a thin film encapsulation layer disposed on the flexible display panel; and a touch screen panel disposed on the thin film encapsulation layer, the touch screen panel being fabricated by using a transfer process.

In some embodiments, the display devices may further include: a color filter disposed on the thin film encapsulation layer; and a black matrix disposed on the same layer as the color filter. Each of the color filter and the back matrix may be fabricated by using the transfer process.

In other embodiments, the color filter and the black matrix may be disposed on the touch screen panel.

In still other embodiments, the touch screen panel may further include a detection electrode for recognizing touch or proximity touch. The color filter may be disposed on the detection electrode.

In even other embodiments, the touch screen panel may be disposed on the color filter and the black matrix.

In yet other embodiments, the touch screen panel may further include a detection electrode for recognizing touch or proximity touch. The detection electrode may be disposed on the black matrix.

In further embodiments, the display devices may further include a cover black matrix disposed on the black matrix and the detection electrode to cover the detection electrode. The cover black matrix may be fabricated by using the transfer process.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF EMBODIMENTS

Figure 1A:
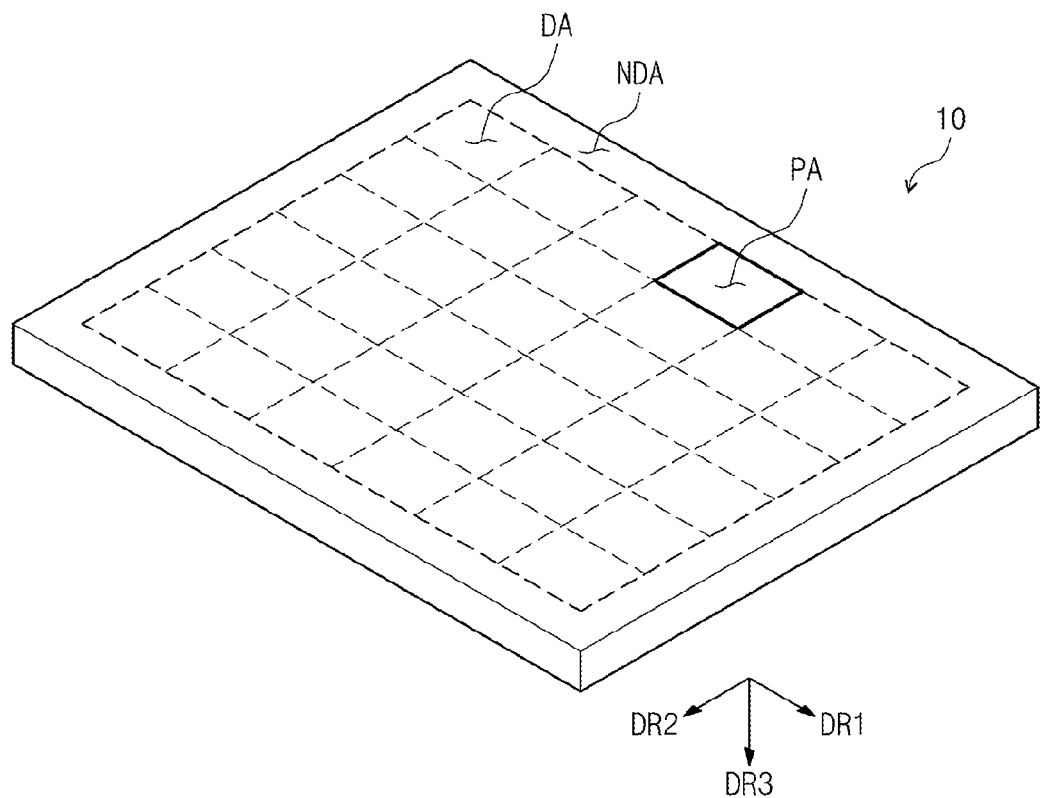
FIG. 1A is a schematic perspective view of a display device according to an embodiment of the inventive concept.

The aspects, features, and advantages of the inventive concept will be understood without difficulties through embodiments below related to the accompanying drawings. The present disclosure may, however, be embodied in different forms and should not be construed as limited to the embodiments set forth herein. Rather, these embodiments are provided so that this disclosure will be thorough and complete, and will fully convey the scope of the inventive concept to those skilled in the art.

Like reference numerals refer to like elements throughout. In the drawings, the dimensions and size of each structure are exaggerated, omitted, or schematically illustrated for convenience in description and clarity. It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

The meaning of 'include' or 'comprise' specifies a property, a region, a fixed number, a step, a process, an element and/or a component but does not exclude other properties, regions, fixed numbers, steps, processes, elements and/or components. In the specification, it will be understood that when a layer (or film), a region, or a plate is referred to as being 'on' another layer, region, or plate, it can be directly on the other layer, region, or plate, or intervening layers, regions, or plates may also be present. On the contrary to this, it will be understood that when a layer (or film), a region, or a plate is referred to as being 'under' another layer, region, or plate, it can be directly under the other layer (or film), region, or plate, or intervening layers, regions, or plates may also be present.

Hereinafter, embodiments of the inventive concept will be described.

FIG. 1A is a schematic perspective view of a display device according to an embodiment of the inventive concept.

Figure 1B:
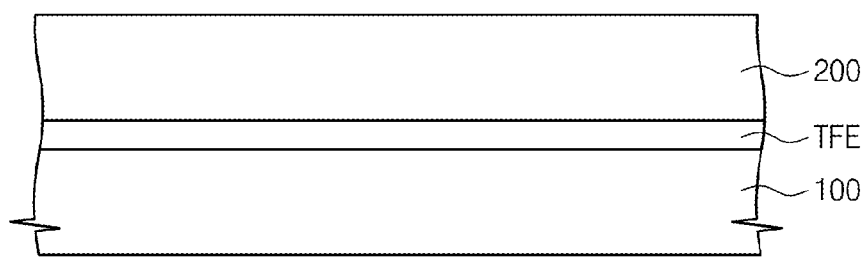
FIG. 1B is a schematic cross-sectional view of the display device according to an embodiment of the inventive concept.

FIG. 1B is a schematic cross-sectional view of the display device according to an embodiment of the inventive concept.

Referring to FIGS. 1A and 1B, a display device 10 according to an embodiment of the inventive concept includes a display area DA and a non-display area NDA. The display device 10 according to an embodiment of the inventive concept includes a flexible display panel 100, a thin film encapsulation layer TFE, and a flexible module layer 200. The thin film encapsulation layer TFE is disposed on the flexible display panel 100. The flexible module layer 200 is disposed on the thin film encapsulation layer TFE. The flexible module layer 200 includes a touch screen panel or touch panel (see reference symbol TSP of FIG. 6C), a color filter (see reference symbol CF of FIG. 7B), and a black matrix (see reference symbol BM of FIG. 7C). The flexible display panel 100, the thin film encapsulation layer TFE, and the flexible module layer 200 will be described below in more detail.

An image is displayed on the display area DA. When viewed in a thickness direction (for example, a direction DR3) of the display device 10, the display area DA may have an approximately rectangular shape, but is not limited thereto.

The display area DA includes a plurality of pixel areas PA. The plurality of pixel areas PA may be arrayed in a matrix form. The plurality of pixel areas PA may be defined by a pixel defining layer (see reference numeral PDL of FIG. 4). The plurality of pixel areas PA may include a plurality of pixels (see reference symbol PX of FIG. 2), respectively.

An image is not displayed on the non-display area NDA. When viewed in the thickness direction DR3 of the display device 10, the non-display area NDA may, for example, surround the display area DA. The non-display area NDA may be adjacent to the display area DA in a first direction DR1 and a second direction DR2 crossing the first direction DR1.

Figure 2:
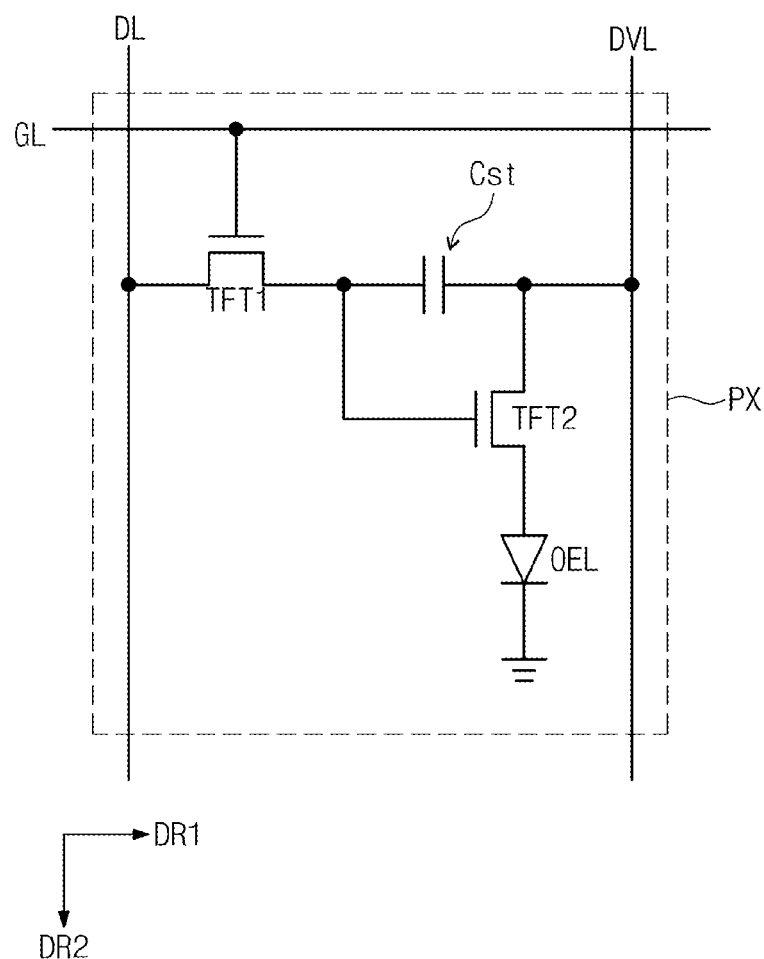
FIG. 2 shows a circuit of one of the pixels provided in the display device according to an embodiment of the inventive concept.

FIG. 2 shows an electric circuit of one of the pixels provided in the display device according to an embodiment of the inventive concept.

Figure 3:
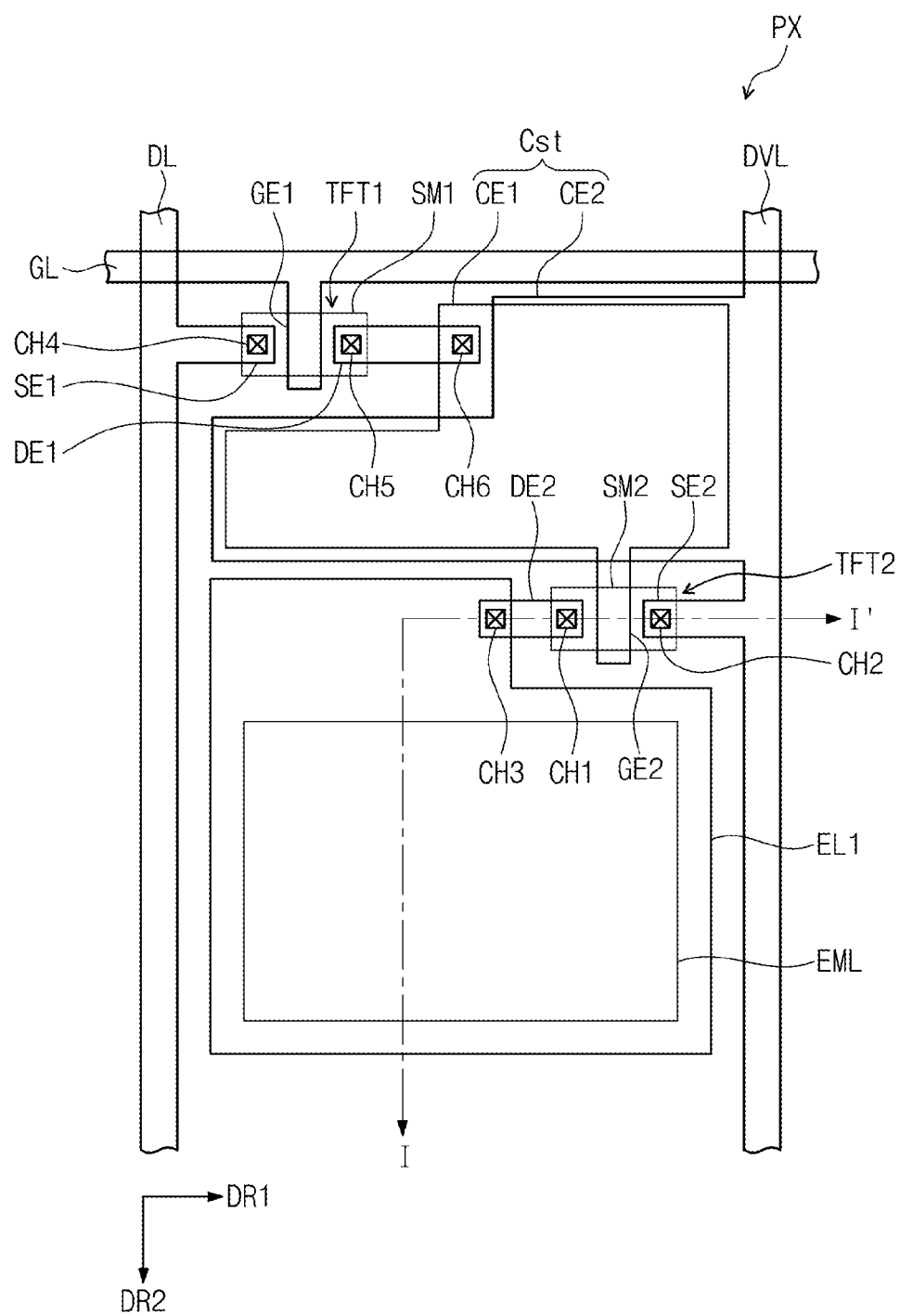
FIG. 3 is a plan view of one of the pixels provided in the display device according to an embodiment of the inventive concept.

FIG. 3 is a plan view of one of the pixels provided in the display device according to an embodiment of the inventive concept.

Figure 4:
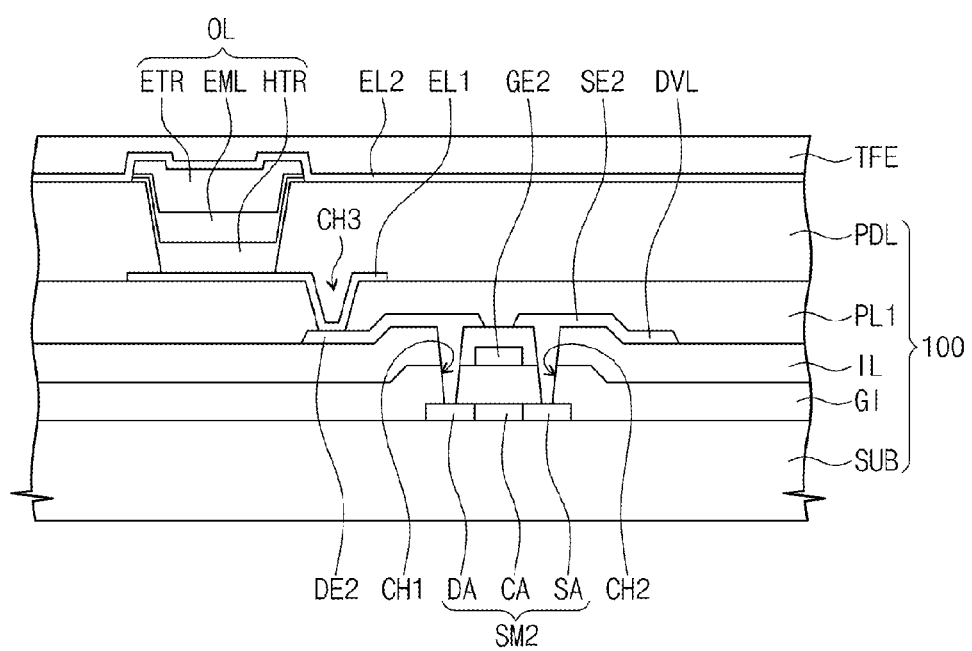
FIG. 4 is a schematic cross-sectional view taken along line I-I' of FIG. 3.

FIG. 4 is a schematic cross-sectional view taken along line I-I' of FIG. 3.

Referring to FIGS. 2 to 4, the flexible display panel 100 includes pixels PX. If the flexible display panel 100 is provided as a commonly used panel, but is not specifically limited, the flexible display panel 100 may be selected from the group consisting of an organic light emitting display panel, a liquid crystal display panel, an electrophoretic display panel, and an electrowetting display panel. Hereinafter, a case in which the flexible display panel 100 is an organic light emitting display panel will be described as an example.

The display device includes conductive lines including a gate line GL, a data line DL, and a driving voltage line DVL. Each pixel includes thin film transistors TFT1 and TFT2 connected to the conductive lines, an organic emitting light device OEL connected to the thin film transistors TFT1 and TFT2, and a capacitor Cst.

Each of the pixels PX may emit light having a specific color, for example, one of red light, green light, and blue light. A kind of color light is not limited to the above-described light. For example, the color light may further include cyan colored light, magenta colored light, and yellow colored light.

The gate line GL extends in a first direction DR1. The data line DL extends in a second direction DR2 that crosses the gate line GL. The driving voltage line DVL extends in the substantially same direction as the data line DL, for example in the second direction DR2. The gate line GL transmits a scanning signal into the thin film transistors TFT1 and TFT2, the data line DL transmits a data signal into the thin film transistors TFT1 and TFT2, and the driving voltage line DVL provides a driving voltage into the thin film transistors TFT1 and TFT2.

The thin film transistors TFT1 and TFT2 may include a driving thin film transistor TFT2 for controlling the organic light emitting device OEL and a switching thin film transistor TFT1 for switching the driving thin film transistor TFT2. Each of the pixels PX includes the two thin film transistors TFT1 and TFT2 in an embodiment of the inventive concept, but is not limited thereto. For example, each of the pixels PX may include one thin film transistor and one capacitor or include at least three thin film transistors and at least two capacitors.

The switching thin film transistor TFT1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a first common electrode CE1 by a fifth contact hole CH5. The switching thin film transistor TFT1 transmits the data signal applied into the data line DL into the driving thin film transistor TFT2 according to the scanning signal applied into the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to the first electrode EL1 by a third contact hole CH3.

The first electrode EU is connected to the second drain electrode DE2 of the driving thin film transistor TFT2. A common voltage is applied to the second electrode EL2, and a light emitting layer EML emits blue light according to an output signal of the driving thin film transistor TFT2 to display an image. The first electrode EU and the second electrode EL2 will be described below in more detail.

The capacitor Cst is connected between the second gate electrode GE2 and the second source electrode SE2 of the driving thin film transistor TFT2 to charge and maintain the data signal inputted into the second gate electrode GE2 of the driving thin film transistor TFT2. The capacitor Cst may include the first common electrode CE1 connected to the first drain electrode DE1 by a sixth contact hole CH6 and a second common electrode CE2 connected to the driving voltage line DVL.

Referring to FIGS. 2 and 4, the display device 10 according to an embodiment of the inventive concept include a base substrate SUB on which the thin film transistors TFT1 and TFT2 and the organic light emitting device OEL are stacked or formed. The base substrate SUB is not specifically limited to a specific material as long as the material can serve as the base substrate BS is usually used. For example, the base substrate SUB may be formed of an insulating material such as glass, plastic, or crystal. An organic polymer for forming the base substrate SUB may include polycarbonate (PC), polyethyeleneterepthalate (PET), polyethylene (PE), polypropylene (PP), polysulphone (PSF), methylmethacrylate (PMMA), triacetyl cellulose (TAC), cyclo-olefin polymer (COP), and cyclo-olefin copolymer (COC). The base substrate SUB may be adequately selected in consideration of mechanical strength, thermal stability, transparency, surface roughness, tractability, waterproofing property, and the like.

A substrate buffer layer may be disposed on the base substrate SUB. The substrate buffer layer may prevent impurities from being diffused into the switching thin film transistor TFT1 and the driving thin film transistor TFT2. The substrate buffer layer may be formed of SiNx, SiOx, or SiOxNy. Also, the substrate buffer layer may be omitted according to the material and process conditions of the base substrate SUB.

A first semiconductor layer SM1 and a second semiconductor layer SM2 are disposed on the base substrate SUB. Each of the first and second semiconductor layers SM1 and SM2 is formed of a semiconductor material. Also, the first and second semiconductor layers SM1 and SM2 may function as active layers of the switching and driving thin film transistors TFT1 and TFT2, respectively. Each of the first and second semiconductor layers SM1 and SM2 includes a source area SA, a drain area DA, and a channel area CA disposed between the source area SA and the drain area DA. Each of the first and second semiconductor layers SM1 and SM2 may be formed of a material selected from an inorganic semiconductor and organic semiconductor. The source area SA and the drain area DA may be doped within n-type impurities or p-type impurities.

A gate insulation layer GI is disposed on the first and second semiconductor layers SM1 and SM2. The gate insulation layer GI covers the first and second semiconductor layers SM1 and SM2. The gate insulation layer GI may be formed of an organic insulation material or inorganic insulation material.

First and second gate electrodes GE1 and GE2 are disposed on the gate insulation layer GI. Each of the first and second gate electrodes GE1 and GE2 covers an area corresponding to the channel area CA of each of the first and second semiconductor layers SM1 and SM2.

An interlayer insulation layer IL is disposed on the first and second gate electrodes GE1 and GE2. The interlayer dielectric IL covers the first and second gate electrodes GE1 and GE2. The interlayer dielectric IL may be formed of an organic insulating material or inorganic insulating material.

The first source and first drain electrodes SE1 and DE1 and the second source and second drain electrodes SE2 and DE2 are disposed on the interlayer dielectric IL. The second drain electrode DE2 contacts the drain area DA of the second semiconductor layer SM2 by a first contact hole CH1 defined in the gate insulation layer GI and the interlayer dielectric IL, and the second source electrode SE2 contacts the source area SA of the second semiconductor layer SM2 by a second contact hole CH2 defined in the gate insulation layer GI and the interlayer dielectric IL. The first source electrode SE1 contacts a source area of the first semiconductor layer SM1 by a fourth contact hole CH4 defined in the gate insulation layer GI and the interlayer dielectric IL, and the first drain electrode DE1 contacts a drain area of the first semiconductor layer SM1 by a fifth contact hole CH5 defined in the gate insulation layer GI and the interlayer dielectric IL.

A first passivation layer PL1 is disposed on the first source and first drain electrodes SE1 and DE1 and the second source and second drain electrodes SE2 and DE2. The first passivation layer PL1 may function as a protection layer for protecting the switching thin film transistor TFT1 and the driving thin film transistor TFT 2 and may also function as a planarization layer for planarizing top surfaces of the switching thin film transistor TFT1 and the driving thin film transistor TFT 2.

The first electrode EU is disposed on the first passivation layer PL1. For example, the first electrode EU may be a positive electrode. The first electrode EL1 is connected to the second drain electrode DE2 of the driving thin film transistor TFT2 through the third contact hole CH3 defined in the first passivation layer PL1.

A pixel defining layer PDL partitioning the pixel areas (see reference symbol PA of FIG. 1A) to respectively correspond to the pixels PX is disposed on the first passivation layer PL1. The pixel defining layer PDL exposes a top surface of the first electrode EL1 and protrudes from the base substrate SUB along a circumference of each of the pixels PX. The pixel defining layer PDL may include, but is not limited to a material thereof, a metal-fluorine ion compound. For example, the pixel defining layer PDL may be formed of one metal-fluorine ion compound of LiF, BaF2, and CsF. If the metal-fluorine ion compound has a predetermined thickness, the metal-fluorine ion compound may have an insulating property. For example, the pixel defining layer PDL may have a thickness of about 10 nm to about 100 nm.

The organic light emitting device OEL is disposed in the pixel area (see reference symbol PA of FIG. 1A) that is surrounded by the pixel defining layer PDL. The organic light emitting device OEL includes a first electrode EL1, a hole transport region HTR, a light emitting layer EML, an electron transport region ETR, and a second electrode EL2.

The first electrode EU may have conductivity. The first electrode EU may be a pixel electrode or positive electrode. The first electrode EU may be a transmissive electrode, a transflective electrode, or a reflective electrode. When the first electrode EU is the transmissive electrode, the first electrode EU may be formed of metal oxide, for example, indium tin oxide (ITO), indium zinc oxide (IZO), zinc oxide (ZnO), or indium tin zinc oxide (ITZO). When the first electrode EU is the transflective or reflective electrode, the first electrode EL1 may be formed of Ag, Mg, Al, Pt, Pd, Au, Ni, Nd, Ir, Cr, or a metal mixture.

An organic layer OL may be disposed on the first electrode EL1. The organic layer OL includes the light emitting layer EML. The organic layer OL may further include the hole transport region HTR and the electron transport region ETR.

The hole transport region HTR is disposed on the first electrode EL1. The hole transport region HTR may include at least one of a hole injection layer, a hole transport layer, a buffer layer, and an electron stop layer.

The hole transport region HTR may have a single layer formed of a single material, a single layer formed of materials different from each other, or a multi-layered structure including a plurality of layers formed of materials different from each other.

For example, the hole transport region HTR may have a single layer structure formed of a plurality of different materials or a structure of the hole injection layer/the hole transport layer, the hole injection layer/the hole transport layer/the buffer layer, the hole injection layer/the buffer layer, the hole transport layer/the buffer layer, or the hole injection layer/the hole transport layer/the electron stop layer, but is not limited thereto.

The light emitting layer EML may be disposed on the hole transport region HTR. The light emitting layer EML may have a single layer structure formed of a single material, a single layer structure formed of materials different from each other, or a multi-layered structure including a plurality of layers formed of materials different from each other.

The light emitting layer EML is not specifically limited to a material thereof if the material for forming the light emitting layer EML is usually used. For example, the light emitting layer EML may be formed of materials that emit red, green, and blue colors. Alternatively, the light emitting layer may include a phosphor material and a fluorescent material. Also, the light emitting layer EML may include a host or dopant.

The electron transport region ETR may be disposed on the light emitting layer EML. The electron transport region ETR may include at least one of a hole stop layer, an electron transport layer, and an electron injection layer, but is not limited thereto.

For example, the electron transport region ETR may have a structure of the electron transport layer/the electron injection layer or the hole stop layer/the electron transport layer/the electron injection layer or a single layer structure in which at least two layers of the above-described layers are combined with each other, but is not limited thereto.

The second electrode EL2 may be disposed on the electron transport region HTR. The second electrode EL2 may be a common electrode formed throughout the display area. The second electrode EL2 may be a negative electrode. The second electrode EL2 may be a transmissive electrode, a transflective electrode, or a reflective electrode.

When the second electrode EL2 is the transmissive electrode, the second electrode EL2 may include Li, Ca, LiF/Ca, LiF/Al, Al, Mg, BaF, Ag or a compound or mixture (e.g., a mixture of Ag and Mg) thereof.

The second electrode EL2 may include an auxiliary electrode. The auxiliary electrode may include a layer formed by depositing the above-described material toward the light emitting layer EML and transparent metal oxide on the layer, for example, indium tin oxide (ITO), indium zinc oxide (IZO), zinc oxide (ZnO), indium tin zinc oxide (ITZO), Mo, or Ti.

When the second electrode EL2 is the transflective electrode or the reflective electrode, the second electrode EL2 may include Ag, Mg, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. Alternatively, the second electrode EL2 may have a multi-layered structure including a reflective layer or transflective layer and a transparent conductive layer formed of indium tin oxide (ITO), indium zinc oxide (IZO), zinc oxide (ZnO), or indium tin zinc oxide (ITZO).

A thin film encapsulation layer TFE for covering the second electrode EL2 may be disposed on the second electrode EL2. The thin film encapsulation layer TFE may include at least one layer of an organic layer and an inorganic layer. The thin film encapsulation layer TFE protects the organic light emitting device OEL.

The flexile module layer (see reference numeral 200 of FIG. 8A) is disposed on the thin film encapsulation layer TFE. The flexible module layer (see reference numeral 200 of FIG. 8A) includes a touch screen panel (see reference symbol TSP of FIG. 6C), a color filter (see reference symbol CF of FIG. 7B), and a black matrix (see reference symbol BM of FIG. 7C). At least a portion of the flexible module layer (see reference numeral 200 of FIG. 8A) may be fabricated by a transfer process.

The touch screen panel (see reference symbol TSP of FIG. 6C) may be disposed on the thin film encapsulation layer TEF. The touch screen panel (see reference symbol TSP of FIG. 6C) may recognize touch of a user, proximity touch of the user, touch of an object (for example, a stylus pen), or proximity touch of the object. The proximity touch may represent a phenomenon in which the touch screen panel (see reference symbol TSP of FIG. 6C) recognizes an approach by a user or object to a position in proximity to the touch screen panel as a touch even though the user or object does not directly touch the touch screen panel (see reference symbol TSP of FIG. 6C). The touch screen panel (see reference symbol TSP of FIG. 6C) may be disposed on the thin film encapsulation layer (TFE) at least partly by a transfer process. In embodiments, detecting electrodes of the touch screen panel can be formed by a transfer process.

The black matrix (see symbol BM of FIG. 7C) and the color filter (see reference symbol CF of FIG. 7B) may be disposed on the thin film encapsulation layer TFE. Each of the black matrix (see symbol BM of FIG. 7C) and the color filter (see reference symbol CF of FIG. 7B) may be disposed on the thin film encapsulation layer TFE by a transfer process. The transfer process and arrangement of the touch screen panel (see reference symbol TSP of FIG. 6C), the black matrix (see reference symbol BM of FIG. 7C), and the color filter (see reference symbol CF of FIG. 7B) will be described below in detail.

Figure 5:
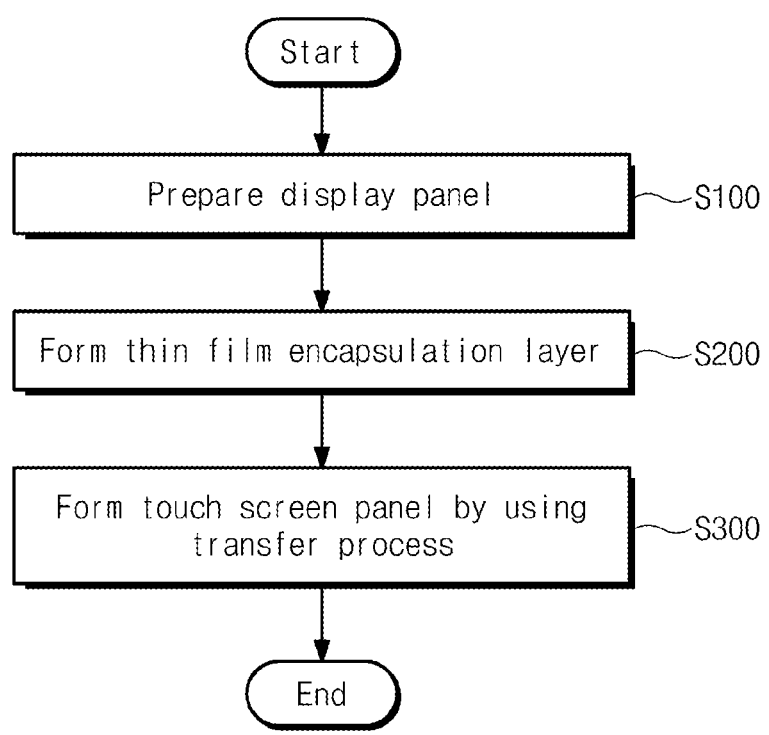
FIG. 5 is a schematic flowchart illustrating a method for fabricating the display device according to an embodiment of the inventive concept.

FIG. 5 is a schematic flowchart illustrating a method for fabricating the display device according to an embodiment of the inventive concept.

Referring to FIGS. 1A, 1B, and 5, a method for fabricating the display device (see reference numeral 10 of FIG. 1A) according to an embodiment of the inventive concept includes a process (S100) of preparing a flexible display panel 100 including a plurality of pixels (see reference symbol PX of FIG. 2) and thin film transistors (see reference symbols TFT1 and TFT2) connected to at least one of the plurality of pixels (see reference symbol PX of FIG. 2), a process (S200) of forming a thin film encapsulation layer TFE on the flexible display panel 100, and a process (S300) of forming a touch screen panel on the thin film encapsulation layer TFE (see reference symbol TSP of FIG. 6C) using a transfer process.

Figure 6A:
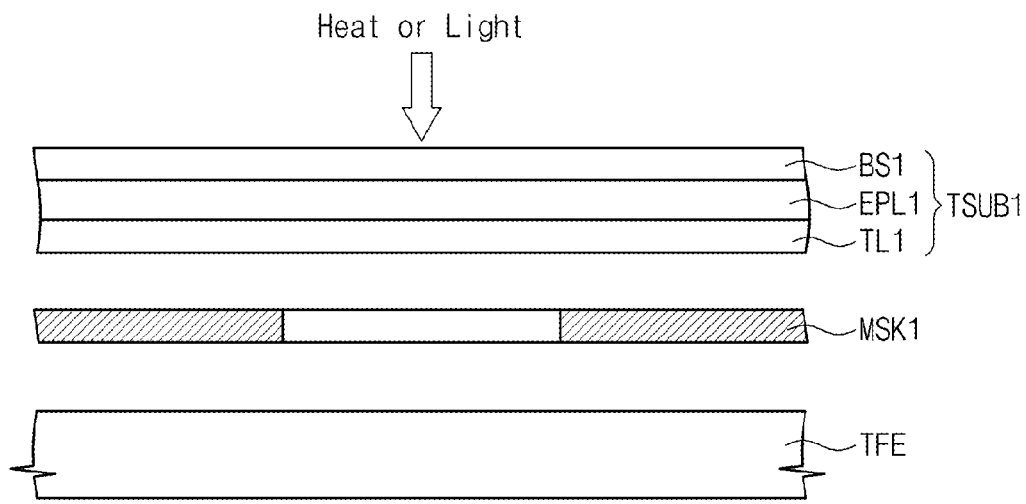
FIGS. 6A, 6B, and 6C are cross-sectional views successively illustrating a method for fabricating a touch screen panel by using a transfer process.
Figure 6B:
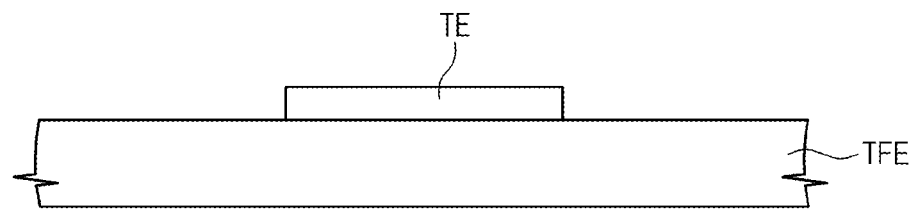
Figure 6C:
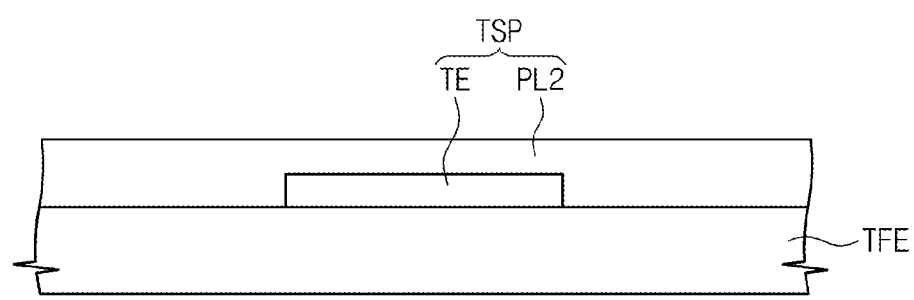

FIGS. 6A, 6B, and 6C are cross-sectional views successively illustrating a method for fabricating the touch screen panel by using the transfer process.

Referring to FIGS. 5, 6A, 6B, and 6C, the process (S300) of forming the touch screen panel TSP includes a process of providing a first transfer substrate or sheet TSUB1 and a process of providing heat or light to the first transfer substrate TSUB1 to transfer a first transfer layer TL1 on the thin film encapsulation layer TFE. Although the first transfer layer TL1 is transferred onto the thin film encapsulation layer TFE in FIGS. 6A, 6B, and 6C, the present disclosure is not limited thereto. For example, the first transfer layer TL1 may be transferred onto various layers such as the black matrix (see reference symbol BM of FIG. 7C) and a third passivation layer (see reference symbol PL3 of FIG. 8B).

The process of providing the first transfer substrate TSUB1 includes a process of providing a first expansion layer EPL1 on a first base film BS1, a process of providing the first transfer layer TL1 on the first expansion layer EPL1, and a process of disposing the first transfer layer TL1 and the thin film encapsulation layer TFE to face each other.

To provide the first transfer sheet TSUB1, first, the first base film BS1 is prepared. The first base film BS1 is not specifically limited to a material thereof if the material for forming the first base film BS1 is commonly used. For example, the first base film BS1 may be formed of polyester such as polyethylene terephthalate, polyacrylic, polyepoxy, polyethylene, and polystyrene.

The first expansion layer EPL1 is formed on the first base film BS1. For example, the first expansion layer EPL1 may be formed of a photo-absorption material having a property that absorbs light having an infrared light region, a visible light region, and an ultraviolet ray region. For example, the first expansion layer EPL1 may include a metal layer formed of aluminum, aluminum oxide, or aluminum sulfide and an organic layer formed of a polymer to which carbon black, graphite, or infrared dye is added. For example, the metal layer may be formed by using a vacuum evaporation process, an E-beam evaporation process, or a sputtering process. Also, the organic layer may be formed by using an extrusion, spin, or knife coating process.

The first transfer layer TL1 is formed on the first expansion layer EPL1. The first transfer layer TL1 may include a metal mesh, an organic material, and an inorganic material. For example, the first transfer layer TL1 may be formed by using the extrusion, spin, or knife coating process, the vacuum evaporation process, or a CVD process.

In embodiments, for forming a touch screen panel using a transfer process, two transfer sheets may be used. The touch screen panel may include a plurality of detection electrodes and a passivation layer formed over the plurality of detection electrodes. When forming the plurality of detection electrodes, a transfer substrate or sheet including a transfer layer TL1 formed of an electrode material is used. When forming the passivation layer, another transfer substrate or sheet including a transfer layer TL1 formed of a passivation material may be used. In an alternative embodiment, the plurality of detection electrodes and the passivation layer are formed over the base film as the transfer layer TL1, and the entire portion of the transfer layer TL1 may be transferred over the thin film encapsulation layer.

The first transfer layer TL1 is disposed to face the thin film encapsulation layer TFE. After the first transfer layer TL1 is disposed to face the thin film encapsulation layer TFE, heat or light may be applied from an upper side of the first base film BS1. The first expansion layer EPL1 may receive the heat or light and thus be expanded. Also, the first transfer layer TL1 formed on the first expansion layer EPL1 may be transferred onto the thin film encapsulation layer TFE. A first mask MSK1 may be disposed between the first transfer layer TL1 and the thin film encapsulation layer TFE. For example, when the first transfer layer TL1 includes the metal mesh, the first transfer layer TL1 may be transferred onto the thin film encapsulation layer TFE to form a detection electrode TE. At least a portion of the detection electrode TE may be transparent. The detection electrode TE may detect touch of a user, proximity touch of the user, touch of an object, or proximity touch of the object.

For example, when the first transfer layer TL1 includes the organic material or inorganic material, the first transfer layer TL1 may be transferred onto the thin film encapsulation layer TFE to form a second passivation layer PL2 on the detection electrode TE. The second passivation layer PL2 may function as a protection layer for protecting the detection electrode TE and also function as a planarization layer for planarizing a top surface of the detection electrode TE. When forming the second passivation layer PL2, another transfer sheet in which the first transfer layer TL1 includes the material of the second passivation layer PL2 may be used. In this process of forming the second passivation layer PL2, a mask may be unnecessary.

In embodiments, a plurality of the detection electrodes TE may be formed in a single transfer process. An organic material layer and inorganic material layer which forms the second passivation layer PL2 may be disposed between two neighboring detection electrodes TE and on the detection electrodes TE.

Figure 7A:
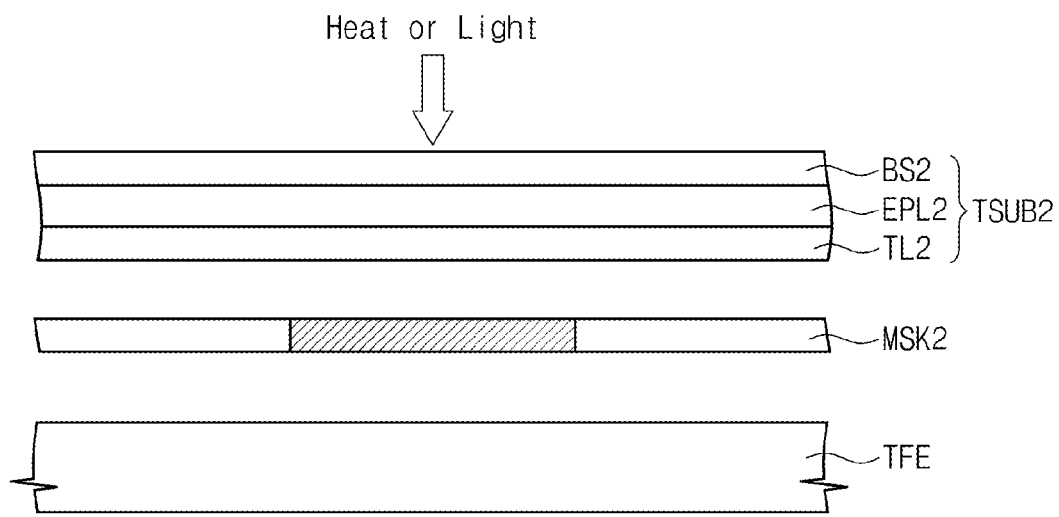
FIGS. 7A, 7B, and 7C are cross-sectional views successively illustrating a method for transferring a color filter and black matrix in the transfer process.
Figure 7B:
Figure 7C:
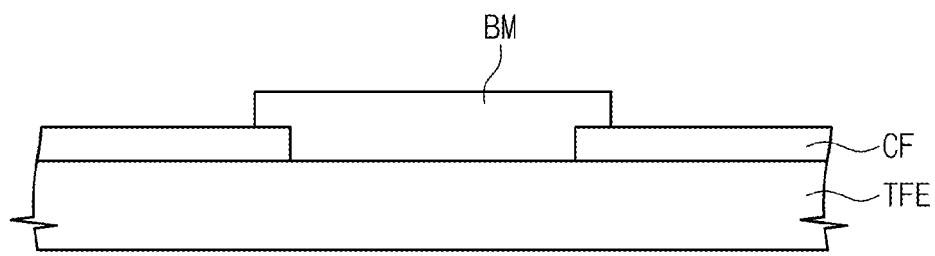

FIGS. 7A, 7B, and 7C are cross-sectional views successively illustrating a method for transferring the color filter and black matrix in the transfer process.

Referring to FIGS. 5, 7A, 7B, and 7C, the method for manufacturing the curved display device (see reference numeral 10 of FIG. 1A) according to an embodiment of the inventive concept may further include a process of performing the transfer process on the thin film encapsulation layer TFE to form the color filter CF and the black matrix BM. Although the second transfer layer TL2 is transferred onto the thin film encapsulation layer TFE in FIGS. 7A, 7B, and 7C, the present disclosure is not limited thereto. For example, the second transfer layer TL2 may be transferred onto various layers such as the second passivation PL2.

The process of forming the color filter CF or the black matrix BM includes a process of providing a second transfer substrate TSUB2 and a process of providing heat or light to the second transfer substrate TSUB2 to transfer the second transfer layer TL2 on the thin film encapsulation layer TFE.

The process of providing the second transfer substrate TSUB2 includes a process of providing a second expansion layer EPL2 on a second base film BS2, a process of providing the second transfer layer TL2 on the second expansion layer EPL2, and a process of disposing the second transfer layer TL2 and the thin film encapsulation layer TFE to face each other.

To provide the second transfer sheet TSUB2, first, the second base film BS2 is prepared. The second base film BS2 is not specifically limited to a material thereof if the material for forming the second base film BS2 is commonly used. For example, the first base film BS1 may be formed of polyester such as polyethylene terephthalate, polyacrylic, polyepoxy, polyethylene, and polystyrene.

The second expansion layer EPL2 is formed on the second base film BS2. For example, the second expansion layer EPL2 may be formed of a photo-absorption material having a property that absorbs light having an infrared light region, a visible light region, and an ultraviolet ray region. For example, the second expansion layer EPL2 may include a metal layer formed of aluminum, aluminum oxide, or aluminum sulfide and an organic layer formed of a polymer to which carbon black, graphite, or infrared dye is added. For example, the metal layer may be formed by using a vacuum evaporation process, an E-beam evaporation process, or a sputtering process. Also, the organic layer may be formed by using an extrusion, spin, or knife coating process.

The second transfer layer TL2 is formed on the second expansion layer EPL2. The second transfer layer TL2 may include an organic material and an inorganic material. For example, the second transfer layer TL2 may be formed by using the extrusion, spin, or knife coating process, the vacuum evaporation process, or a CVD process.

In embodiments, for forming an optical layer using a transfer process, multiple transfer sheets may be used. The optical layer may include a plurality of first color filters with a first color, a plurality of second color filters with a second color, a plurality of third color filters with a third color, a black matrix and a passivation layer formed over the color filter and the black matrix. When forming the plurality of first color filters, a transfer substrate or sheet including a transfer layer TL2 formed of a first color filter material may be used. When forming the plurality of second color filters, a transfer substrate or sheet including a transfer layer TL2 formed of a second color filter material may be used. When forming the plurality of third color filters, a transfer substrate or sheet including a transfer layer TL2 formed of a third color filter material may be used. Further, when forming the black matrix, a transfer substrate or sheet including a transfer layer TL2 formed of a black matrix material may be used. When forming the passivation layer, a transfer substrate or sheet including a transfer layer TL2 formed of a passivation material may be used. In an alternative embodiment, the plurality of first color filters, the plurality of second color filters, the plurality of third color filters, the black matrix and the passivation layer are formed over the base film as the transfer layer TL2, and then, the entire portion of the transfer layer TL2 may be transferred over the thin film encapsulation layer.

Referring to FIG. 7A, in embodiments, the second transfer layer TL2 is disposed to face the thin film encapsulation layer TFE. After the second transfer layer TL2 is disposed to face the thin film encapsulation layer TFE, heat or light may be applied from an upper side of the second base film BS2. The second expansion layer EPL2 may receive the heat or light and thus be expanded. Also, the second transfer layer TL2 formed on the second expansion layer EPL2 may be transferred onto the thin film encapsulation layer TFE. A second mask MSK2 may be disposed between the second transfer layer TL2 and the thin film encapsulation layer TFE. For example, when the second transfer layer TL2 includes the organic material or inorganic material, the second transfer layer TL2 may be transferred onto the thin film encapsulation layer TFE to form the color filter CF, the black matrix BM, and the second passivation layer PL2. As shown in FIGS. 7B and 7C, a black matrix may be formed using a transfer method such that a portion of the black matrix is disposed between two neighboring color filters. The second passivation layer PL2 may function as a protection layer for protecting the color filter CF and the black matrix BM and also function as a planarization layer for planarizing top surfaces of the color filter CF and the black matrix BM.

FIGS. 8A, 8B, 8C, and 8D are schematic cross-sectional views of the display device according to an embodiment of the inventive concept.

Referring to FIGS. 8A, 8B, 8C, and 8D, the touch screen panel TSP, the color filter CF and the black matrix BM which are formed by using the transfer process may have various layered-structures. Although each of the touch screen panel TSP, the color filter CF, and the black matrix BM is formed by using the transfer process in FIGS. 8A, 8B, 8C, and 8D, the present disclosure is not limited thereto. For example, only a portion of each of the touch screen panel TSP, the color filter CF, and the black matrix BM, which contacts the thin film encapsulation layer TFE may be formed by using the transfer process.

Figure 8A:
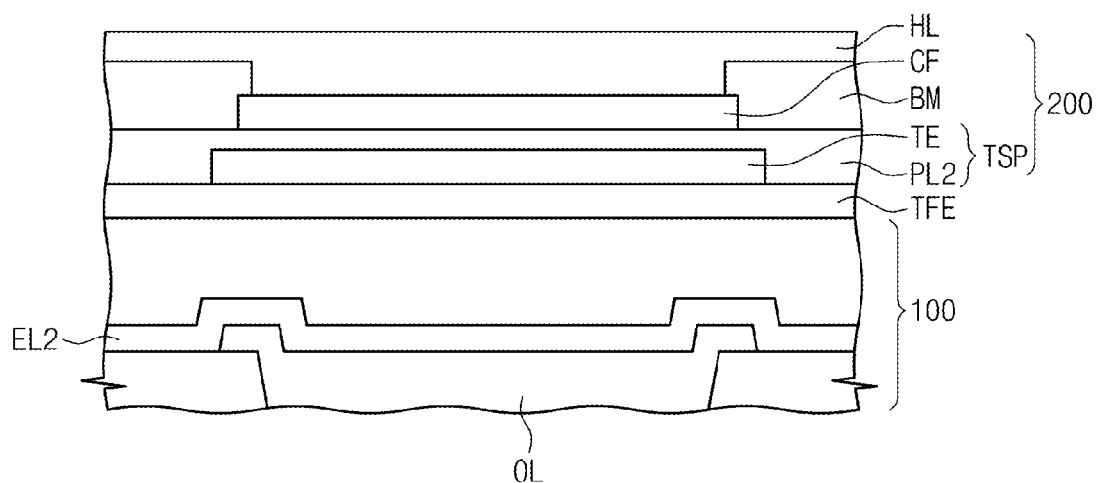
FIGS. 8A, 8B, 8C, and 8D are schematic cross-sectional views of the display device according to an embodiment of the inventive concept.

Referring to FIG. 8A, a detection electrode TE may be formed on the thin film encapsulation layer TFE by using the transfer process. The detection electrode TE may detect touch of a user, proximity touch of the user, touch of an object, or proximity touch of the object. For example, the detection electrode TE may be formed by using the transfer process that is described in FIGS. 5, 6A, 6B, and 6C. At least a portion of the detection electrode TE may be transparent.

In embodiments, a plurality of detection electrodes TE may be provided. In embodiments, an organic material layer and inorganic material layer may be disposed between the detection electrodes TE and on the detection electrodes TE.

The second passivation layer PL2 may be formed on the detection electrode TE. The second passivation layer PL2 may be formed by using the transfer process. However, the present disclosure is not limited thereto. For example, the second passivation layer PL2 may be formed by using spin coating or flash evaporation. In embodiments, an organic material layer and inorganic material layer may be disposed between the detection electrodes TE and on the detection electrodes TE.

The color filter CF and the black matrix BM may be formed on the second passivation layer PL2 by using the transfer process. For example, each of the color filter CF and the black matrix BM may be formed by using the transfer process that is described in FIGS. 5, 7A, 7B, and 7C. The color filter CF and the black matrix BM may be provided to have a predetermined shape, for example, such as a grid pattern.

The color filter CF provides a color to light emitted from the light emitting layer (see reference symbol EML of FIG. 4). The color filter CF may overlap an organic layer OL of the flexile display panel 100.

The black matrix BM may absorb light emitted from the light emitting layer (see reference symbol EML of FIG. 4). The block matrix BM may overlap a light blocking area of the flexible display panel 100. The light blocking area may be defined as an area on which a gate line, a data line, and the thin film transistors (see reference symbols TFT1 and TFT2 of FIG. 2). The black matrix BM may absorb light to prevent light leakage from occurring through the light blocking area.

A layer including the color filter CF and the black matrix BM may function as a polarization plate. The light emitted from light emitting layer (see reference symbol EML of FIG. 4) may be polarized while passing through the optical layer. Thus, a user may recognize an image that is displayed by the light passing through the polarization plate.

External light provided from the outside may be polarized while passing through the polarization plate. Then, after the light is reflected by the flexible display panel 100, the reflected light may be blocked and thus may not be emitted to the outside. Thus, the user may not recognize the external light that is incident from the outside.

A hard coating layer HL may be formed on the color filter CF and the black matrix BM. The hard coating layer HL may protect the color filter CF and the black matrix BM. The hard coating layer HL is not limited to a material thereof if the material for forming the hard coating layer HL is commonly used. For example, the hard coating layer HL may be formed by using slit coating.

In embodiments, a window may be disposed between the color filter CF, and the black matrix BM, and the hard coating layer HL. The window is not limited to a material thereof if the material for forming the window is commonly used. For example, the window may be formed of glass.

Hereinafter, a display device 10 and a method for fabricating the display device 10 will be described with reference to FIGS. 8B, 8C, and 8D. Hereinafter, different points between the display device 10 and the method for fabricating the display device 10, which are described with reference to FIG. 8A and the display device 10 and the method for fabricating the display device 10, which are described with reference to FIGS. 8B, 8C, and 8D will be mainly described, and thus, non-explained portions will be quoted from the display device 10 and the method for fabricating the display device 10 which are described with reference to FIG. 8A.

Figure 8B:
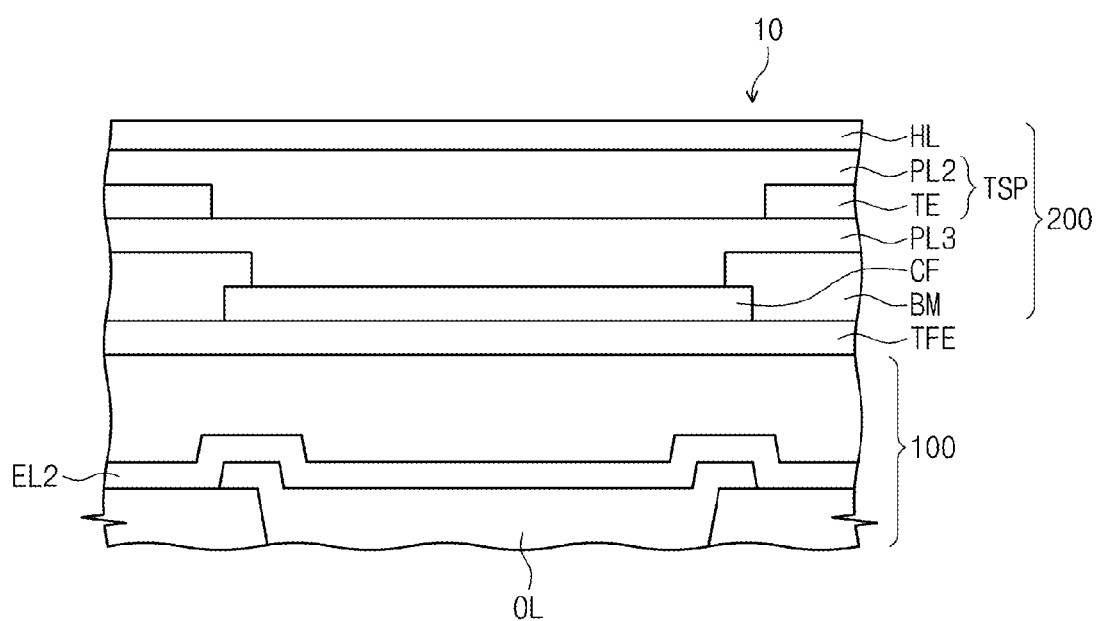

Referring to FIG. 8B, a color filter CF and a black matrix BM may be formed by using a transfer process. For example, each of the color filter CF and the black matrix BM may be formed by using the transfer process that is described in FIGS. 5, 7A, 7B, and 7C. The color filter CF provides a color to light emitted from the light emitting layer (see reference symbol EML of FIG. 4). The color filter CF may overlap an organic layer OL of a flexible display panel 100. The black matrix BM may absorb light emitted from the light emitting layer (see reference symbol EML of FIG. 4). The block matrix BM may overlap a light blocking area of the flexible display panel 100. A layer including the color filter CF and the black matrix BM may function as a polarization plate.

A third passivation layer PL3 may be formed on the color filter CF and the black matrix BM. The third passivation layer PL3 may be formed by using the transfer process. However, the present disclosure is not limited thereto. For example, the third passivation layer PL3 may be formed by using spin coating or flash evaporation.

A detection electrode TE may be formed on the third passivation layer PL3 by using the transfer process. For example, the detection electrode TE may be formed by using the transfer process that is described in FIGS. 5, 6A, 6B, and 6C. In embodiments, a plurality of detection electrodes TE may be provided. The detection electrode TE may overlap the black matrix BM and may not overlap the color filter CF. Since the detection electrode TE does not overlap the color filter CF, but overlap the black matrix BM, an aperture ratio may not be reduced to maintain reliability of the display device 10.

A second passivation layer PL2 may be formed on the detection electrode TE. The second passivation layer PL2 may be formed by using the transfer process. However, the present disclosure is not limited thereto. For example, the second passivation layer PL2 may be formed by using spin coating or flash evaporation. In embodiments, an organic material layer and inorganic material layer may be disposed between the detection electrodes TE and on the detection electrodes TE.

A hard coating layer HL may be formed on the second passivation layer PL2. The hard coating layer HL may protect the detection electrode TE. The hard coating layer HL is not limited to a material thereof if the material for forming the hard coating layer HL is usually used. For example, the hard coating layer HL may be formed by using slit coating.

Figure 8C:
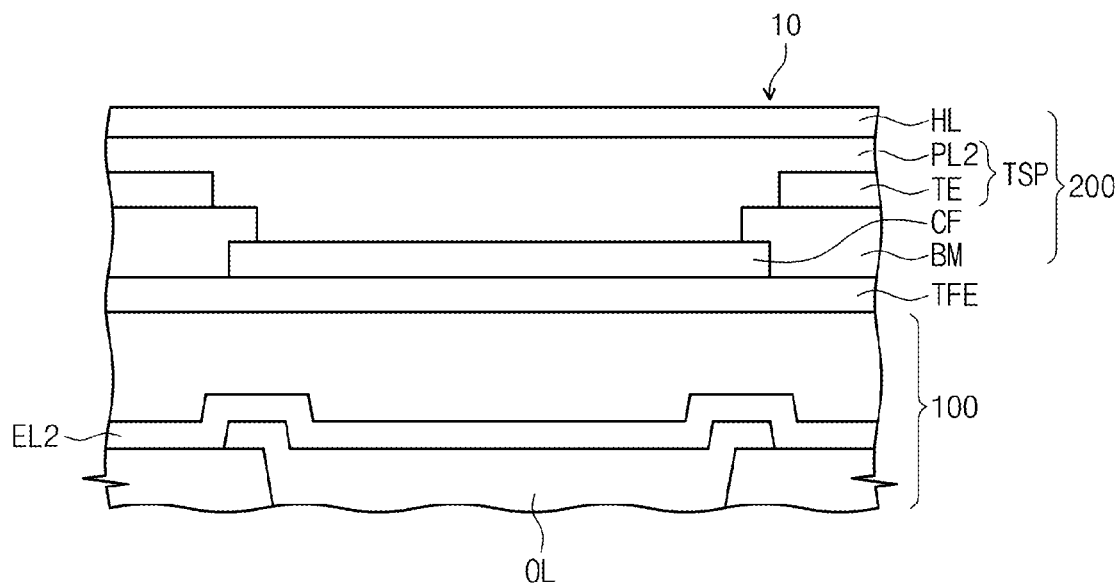

Referring to FIG. 8C, a color filter CF and a black matrix BM may be formed by using the transfer process. For example, each of the color filter CF and the black matrix BM may be formed by using the transfer process that is described in FIGS. 5, 7A, 7B, and 7C. The color filter CF provides a color to light emitted from the light emitting layer (see reference symbol EML of FIG. 4). The color filter CF may overlap an organic layer OL of a flexible display panel 100. The black matrix BM may absorb light emitted from the light emitting layer (see reference symbol EML of FIG. 4). The block matrix BM may overlap a light blocking area of the flexible display panel 100. A layer including the color filter CF and the black matrix BM may function as a polarization plate.

A detection electrode TE may be formed on the black matrix BM by using the transfer process. For example, the detection electrode TE may be formed by using the transfer process that is described in FIGS. 5, 6A, 6B, and 6C. The detection electrode TE may overlap the black matrix BM and may not overlap the color filter CF. Since the detection electrode TE does not overlap the color filter CF, but overlap the black matrix BM, an aperture ratio may not be reduced to maintain reliability of the display device 10. In embodiments, a plurality of detection electrodes TE may be provided.

A second passivation layer PL2 may be formed on the color filter CF, the black matrix BM, and the detection electrode TE. The second passivation layer PL2 may be formed by using the transfer process. However, the present disclosure is not limited thereto. For example, the second passivation layer PL2 may be formed by using spin coating or flash evaporation. In embodiments, an organic material layer and inorganic material layer may be disposed between the detection electrodes TE and on the detection electrodes TE.

A hard coating layer HL may be formed on the second passivation layer PL2. The hard coating layer HL may protect the color filter CF, the black matrix BM, and the detection electrode TE. The hard coating layer HL is not limited to a material thereof if the material for forming the hard coating layer HL is usually used. For example, the hard coating layer HL may be formed by using slit coating.

Figure 8D:
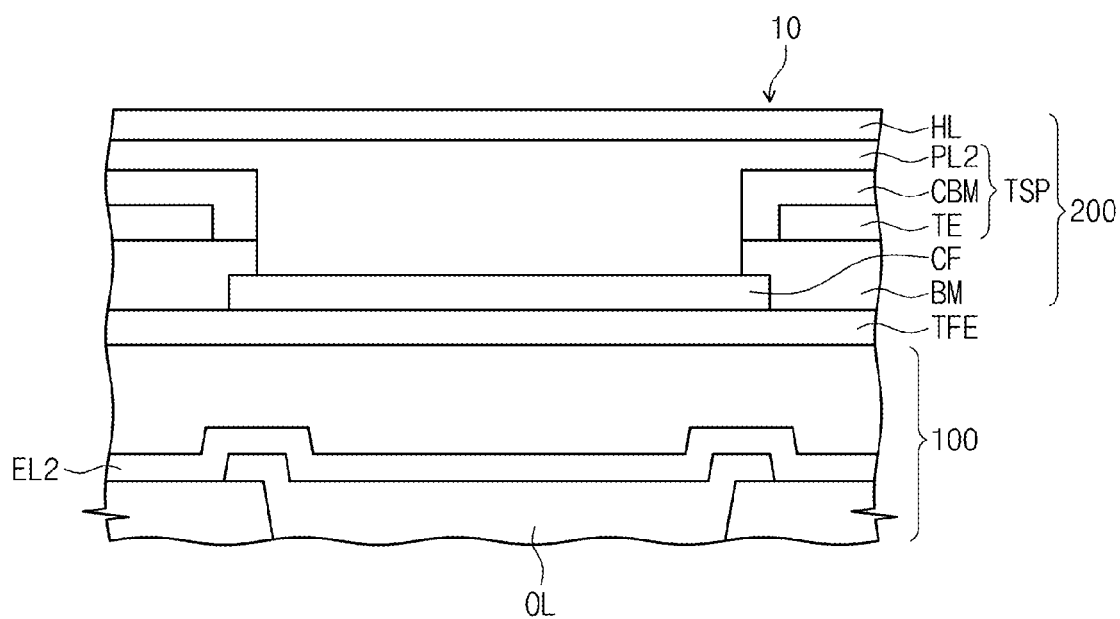

Referring to FIG. 8D, a color filter CF and a black matrix BM may be formed by using the transfer process. For example, each of the color filter CF and the black matrix BM may be formed by using the transfer process that is described in FIGS. 5, 7A, 7B, and 7C. The color filter CF provides a color to light emitted from the light emitting layer (see reference symbol EML of FIG. 4). The color filter CF may overlap an organic layer OL of a flexible display panel 100. The black matrix BM may absorb light emitted from the light emitting layer (see reference symbol EML of FIG. 4). The block matrix BM may overlap a light blocking area of the flexible display panel 100. A layer including the color filter CF and the black matrix BM may function as a polarization plate.

A detection electrode TE may be formed on the black matrix BM by using the transfer process. For example, the detection electrode TE may be formed by using the transfer process that is described in FIGS. 5, 6A, 6B, and 6C. The detection electrode TE may overlap the black matrix BM and may not overlap the color filter CF. Since the detection electrode TE does not overlap the color filter CF, but overlap the black matrix BM, an aperture ratio may not be reduced to maintain reliability of the display device 10. In embodiments, a plurality of detection electrodes TE may be provided.

Another black matrix, which is referred to a cover black matrix CBM, may be formed on the black matrix BM and the detection electrode TE by using the transfer process. For example, the cover black matrix CBM may be formed by using the transfer process that is described in FIGS. 5, 7A, 7B, and 7C. The cover black matrix CBM may be disposed on the black matrix BM and the detection electrode TE to cover the detection electrode TE. Although the cover black matrix CBM completely overlaps the black matrix BM in FIG. 8D, the present disclosure is not limited thereto. For example, the cover black matrix CBM may overlap a portion of the black matrix BM.

The cover black matrix CBM may be formed of the same material as the black matrix BM. However, the present disclosure is not limited thereto. For example, the cover black matrix CBM may be formed of a material different from that of the black matrix BM.

A second passivation layer PL2 may be formed on the color filter CF and the cover black matrix CBM. The second passivation layer PL2 may be formed by using the transfer process. However, the present disclosure is not limited thereto. For example, the second passivation layer PL2 may be formed by using spin coating or flash evaporation. In embodiments, an organic material layer and inorganic material layer may be disposed between the detection electrodes TE and on the detection electrodes TE.

A hard coating layer HL may be formed on the second passivation layer PL2. The hard coating layer HL may protect the color filter CF, the black matrix BM, the cover black matrix CBM, and the detection electrode TE. The hard coating layer HL is not limited to a material thereof if the material for forming the hard coating layer HL is usually used. For example, the hard coating layer HL may be formed by using slit coating.

In the method for fabricating the display device according to embodiments of the present invention, the flexible module may be formed on the thin film encapsulation layer by using the transfer process. Therefore, the process of fabricating the flexible module may be directly performed on the thin film encapsulation layer without performing a separate lamination process to simplify the method for fabricating the display device.

Also, the display device according to the embodiment of the inventive concept may include the flexible module that is fabricated by using the transfer process. In addition to, a layer including the color filter and the black matrix may function as a polarization plate to realize slimness of the display device.

In the method for fabricating the display device according to the embodiment of the inventive concept, the display device may be simplified in the fabricating process and reduced in thickness.

In the display device according to the embodiment of the inventive concept, the display device that is fabricated through the simple fabricating process and has the thin thickness may be provided.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A method for fabricating a display device, the method comprising:
    preparing a flexible display panel comprising a plurality of pixels and a thin film transistor connected to at least one of the plurality of pixels;
    forming a thin film encapsulation layer over the flexible display panel; and
    forming a touch screen panel over the thin film encapsulation layer, wherein the touch screen panel is formed at least partly by a transfer process,
    wherein the forming of the touch screen panel comprises:
    placing a first transfer sheet over the encapsulation layer, the first transfer sheet comprising a first transfer layer; and
    providing heat or light to the first transfer sheet, thereby transferring the first transfer layer over the thin film encapsulation layer, wherein the touch screen panel comprises the first transfer layer transferred over the thin film encapsulation layer,
    wherein the first transfer sheet comprises:
    a first base film;
    the first expansion layer formed over the first base film; and
    the first transfer layer formed over the first expansion layer, the first transfer layer comprises a first surface facing away from the first base film,
    wherein placing comprises disposing the first transfer sheet over the thin film encapsulation layer such that the first surface faces the thin film encapsulation layer.

2. The method of claim 1, further comprising forming an optical layer comprising a color filter and a black matrix over the thin film encapsulation layer, wherein the optical layer is formed at least partly by a transfer process.

3. The method of claim 2, wherein the forming of the optical layer comprises:
    placing a second transfer sheet over the encapsulation layer, the second transfer sheet comprising a second transfer layer; and
    providing heat or light to the second transfer sheet, thereby transferring the second transfer layer over the thin film encapsulation layer, wherein the optical layer comprises the second transfer layer transferred over the thin film encapsulation layer.

4. The method of claim 3, wherein the second transfer sheet comprises:
    a second base film;

a second expansion layer formed over the second base film; and the second transfer layer formed over the second expansion layer, the second transfer layer comprises a second surface facing away from the second base film, wherein placing comprises disposing the second transfer sheet over the thin film encapsulation layer such that the second surface faces the thin film encapsulation layer.

5. The method of claim 2, wherein the touch screen panel is disposed between the flexible display panel and the optical layer.

6. The method of claim 5, wherein the touch screen panel comprises a detection electrode, and wherein the optical layer comprises the color filter disposed over the detection electrode.

7. The method of claim 2, wherein the optical layer is disposed between the flexible display panel and the touch screen panel.

8. The method of claim 2, wherein the touch screen panel comprises a detection electrode formed over the black matrix.

9. The method of claim 8, wherein the touch screen panel further comprises another black matrix which covers the detection electrode and is formed over the detection electrode by using a transfer process, the detection electrode being disposed between the black matrix and the other black matrix, wherein the substantially entire portion of the detection electrode overlaps the black matrix and the other black matrix when viewed in a direction perpendicular to a major surface of the thin film encapsulation layer.

10. A display device comprising:
a flexible display panel comprising a plurality of pixels and a thin film transistor connected to at least one of the plurality of pixels;
a thin film encapsulation layer disposed over the flexible display panel;
a touch screen panel disposed over the thin film encapsulation layer;
a color filter disposed over the thin film encapsulation layer; and
a black matrix disposed over the thin film encapsulation layer,
wherein the touch screen panel comprises a portion fabricated by using a first transfer process, and
each of the color filter and the black matrix is fabricated by using a second transfer process which is different from the first transfer process.

11. The display device of claim 10, wherein the color filter and the black matrix are disposed over the touch screen panel.

12. The display device of claim 11, wherein the touch screen panel further comprises a detection electrode configured to recognize a user's touch, wherein the color filter is disposed over the detection electrode.

13. The display device of claim 10, wherein the touch screen panel is disposed over the color filter and the black matrix.

14. The display device of claim 13, wherein the touch screen panel comprises a detection electrode configured to recognize a user's touch, wherein the detection electrode is disposed over the black matrix.

15. The display device of claim 14, further comprising another black matrix disposed over the black matrix and the detection electrode to cover the detection electrode, wherein the other black matrix is fabricated by using a transfer process, wherein the substantially entire portion of the detection electrode overlaps the black matrix and the other black matrix when viewed in a direction perpendicular to a major surface of the thin film encapsulation layer.

16. A display device comprising:
a flexible display panel comprising a plurality of pixels and a thin film transistor connected to at least one of the plurality of pixels;
a thin film encapsulation layer disposed over the flexible display panel; and
a flexible module layer comprising a detection electrode, a color filter, and a black matrix, the flexible module layer being disposed over the thin film encapsulation layer, and comprising at least a portion fabricated by using a transfer process,
wherein at least one of the detection electrode, the color filter, and the black matrix directly contacts the thin film encapsulation layer.

17. The device of claim 16, wherein the flexible module layer comprises a touch panel, wherein the at least a portion comprises a plurality of electrodes of the touch panel.

* * * * *